(12) United States Patent
Takahata et al.

(10) Patent No.: US 7,391,101 B2
(45) Date of Patent: Jun. 24, 2008

(54) SEMICONDUCTOR PRESSURE SENSOR

(75) Inventors: Yoshimitsu Takahata, Tokyo (JP);
Hiroshi Nakamura, Tokyo (JP);
Masaaki Taruya, Tokyo (JP); Shinsuke Asada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 232 days.

(21) Appl. No.: 11/287,388

(22) Filed: Nov. 28, 2005

(65) Prior Publication Data
US 2007/0029657 A1 Feb. 8, 2007

(30) Foreign Application Priority Data
Aug. 2, 2005 (JP) ............... 2005-223699

(51) Int. Cl.
*H01L 23/495* (2006.01)
*H01L 21/00* (2006.01)
*H01R 9/00* (2006.01)

(52) U.S. Cl. .................. 257/672; 257/676; 257/692; 257/784; 257/790; 257/E33.066; 257/E23.031; 257/E23.043; 361/773; 361/813; 438/123

(58) Field of Classification Search ............. None
See application file for complete search history.

(56) References Cited

U.S. PATENT DOCUMENTS
6,680,525 B1 * 1/2004 Hsieh et al. ............. 257/680
6,979,873 B2 * 12/2005 Fujii .................... 257/417

FOREIGN PATENT DOCUMENTS
| JP | 11-304619 A | 11/1999 |
| JP | 2001-296197 | 10/2001 |
| JP | 2002-162306 | 6/2002 |

\* cited by examiner

*Primary Examiner*—Alonzo Chambliss
(74) *Attorney, Agent, or Firm*—Sughrue Mion, PLLC

(57) ABSTRACT

A semiconductor pressure sensor can reduce the damage of bonding wires to increase their life time even under an environment in which the temperature and pressure change rapidly and radically. The semiconductor pressure sensor includes a package (1) made of a resin and having a concave portion (1*a*), a lead (2) formed integral with the package (1) by insert molding, with its one end exposed into the concave portion (1*a*) and its other end extended from the package (1) to the outside, a sensor chip (3) arranged in the concave portion (1*a*) for detecting pressure, and a bonding wire (4) electrically connecting the sensor chip (3) and the lead (2) with each other. An interface between the lead (2) and the package (1) on the side of the concave portion (1*a*) is covered with a first protective resin portion (6) of electrically insulating property, and the bonding wire (4) is covered with a second protective resin portion (7) that is softer than the first protective resin portion (6).

6 Claims, 4 Drawing Sheets

SEMICONDUCTOR PRESSURE SENSOR

BACKGROUND OF THE INVENTION

1. Field of the Invention

The present invention relates to a semiconductor pressure sensor for detecting a pressure such as, for example, the pressure in an intake manifold of an internal combustion engine, the internal pressure of a tank, etc

2. Description of the Related Art

As a general pressure sensing element, there has been known a semiconductor pressure sensor using a piezoresistive effect, for example.

Such a semiconductor pressure sensor is constructed as follows. That is, a seat with a diaphragm bonded thereto is arranged in a concave portion of a package, and a strain gauge formed on the diaphragm serves to catch, as a change in resistance, a strain or distortion of the diaphragm that is caused by a pressure difference between a medium or fluid to be measured and a vacuum chamber defined between the diaphragm and the seat, so that the change in resistance is output as an electric signal to the outside through leads, and the pressure of the fluid to be measured is thereby detected.

The diaphragm and the leads are electrically connected with each other through bonding wires, and the diaphragm and the bonding wires are covered with and protected by an electrically insulating protective resin material or portion so as to ensure the corrosion resistance and the electrical insulation thereof to the medium to be measured, but as such a resin material, there is used a relatively soft one such as for example a gel so as not to obstruct the strain or distortion deformation of the diaphragm.

However, minute gaps or clearances are formed in interfaces between the package and the leads which are formed integral with the package by means of insert molding, so when the diaphragm and the bonding wires are covered with the protective resin portion, air existing in the interfaces is released into the protective resin portion, as a result of which a stress is applied to the bonding wires, thereby causing a fear that the bonding wires might be damaged.

In order to prevent such a situation, a countermeasure is taken in which work to cover the protective resin portion is carried out under a vacuum atmosphere so as to reduce the amount of air confined or trapped in the interfaces, but even in this case, when the diaphragm is subjected to a negative pressure lower than the atmospheric pressure, the air existing in the minute gap expands as air bubbles to invade into the protective resin portion, whereby the protective resin portion and the bonding wires are stressed, and hence there was still a problem that the damage of the bonding wires might be caused.

Here, note that a similar problem was generated by the air that invaded from the outside of the package through small gaps.

As a means for solving such problems, for example, a semiconductor pressure sensor is described in a first patent document (Japanese patent application laid-open No. H11-304619 (FIG. 1)). That is, a concave portion side, lower portions of the bonding wires and the leads on the interfaces between the leads and the package are covered with a first relatively hard, insulating protective resin portion thereby to confine air in the interface, and the diaphragm and upper portions of the bonding wires are covered with a second relatively soft protective resin portion.

However, in the above-mentioned semiconductor pressure sensor, the bonding wires are covered with the first protective resin portion and the second protective resin portion which are different from each other in the coefficient of linear expansion and the elastic modulus, so a difference or variation in the stress or distortion of the first protective resin portion and the second protective resin portion caused by a temperature change or a pressure change acts on the bonding wires as a large force as it is. Accordingly, even in this case, there was a problem that the bonding wires might be damaged.

SUMMARY OF THE INVENTION

The present invention is intended to obviate the above-mentioned problems, and has for its object to obtain a semiconductor pressure sensor in which the damage of bonding wires can be reduced to increase their life time even under an environment in which the temperature and pressure change rapidly and radically.

A semiconductor pressure sensor according to the present invention includes: a package made of a resin and having a concave portion; a lead formed integral with the package by insert molding, with its one end exposed into the concave portion and its other end extended from the package to the outside; a semiconductor chip arranged in the concave portion; and a bonding wire electrically connecting the semiconductor chip and the lead with each other. An interface between the lead and the package on the side of the concave portion is covered with a first protective resin portion of electrically insulating property, and the bonding wire is covered with a second protective resin portion that is softer than the first protective resin portion.

According to the semiconductor pressure sensor of the present invention, the damage of the bonding wires can be reduced even under an environment in which the temperature and pressure change rapidly or drastically, and hence the life time of the pressure sensor can be increased.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying

Embodiment 1

Figure 1:
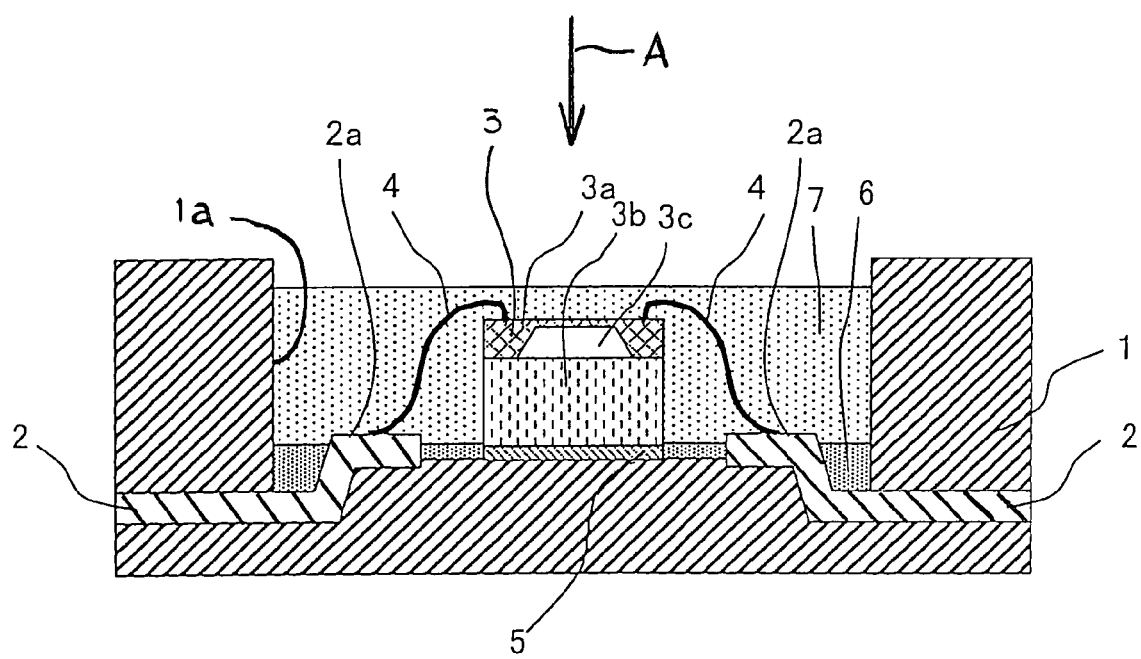
FIG. 1 is a cross sectional view showing a semiconductor pressure sensor according to a first embodiment of the present invention.

FIG. 1 is a cross sectional view that shows a semiconductor pressure sensor according to a first embodiment of the present invention.

In this semiconductor pressure sensor, a concave portion 1a for insulation of a semiconductor chip in the form of a sensor chip 3 is formed in a package 1 made of epoxy resin of a thermosetting property.

The sensor chip 3 is comprised of a glass seat 3b with a bonding portion 5 bonded to the bottom of the concave portion 1a, and a diaphragm 3a made of a Si material and attached to the glass seat 3b through anode bonding. Formed between the diaphragm 3a and the glass seat 3b is a vacuum chamber 3c which serves as a reference for measured pressure.

A strain gauge, which constitutes a Wheatstone bridge circuit, is formed on the diaphragm 3a.

Leads 2 are formed integral with the package 1 by insert molding, and have their one end exposed into the concave portion 1a, and their other end extended from the package 1 to the outside. At the one end of each lead 2, there is formed a bonding pad 2a that is bent in its immediate portion toward the diaphragm 3a in a stepwise fashion. A plurality of bonding wires 4 made of gold have their opposite ends connected with the bonding pads 2a and the edge of the diaphragm 3a by means of thermo-compression bonding using ultrasonic waves in combination.

In order to ensure protection, corrosion resistance and insulation against invasion of foreign matter into a medium to be measured, a first protective resin portion 6 and a second protective resin portion 7 both of electrically insulating property are formed in the concave portion 1a.

The first protective resin portion 6 covers the bottom of the concave portion 1a. The first protective resin portion 6 need only to cover at least interfaces between the leads 2 and the package 1 at least on the side of the concave portion 1a. The first protective resin portion 6 is made of a gummy or gel material of relatively high hardness, and serves to primarily prevent air bubbles from being released from the interfaces between the leads 2 and the package 1 into the concave portion 1 a when the interior of the concave portion 1a is subjected to negative pressure. In other words, the first protective resin portion 6 has a sealing function.

Here, not that the bonding wires 4 and the leads 2 shown in FIG. 1 serve as output paths from the Wheatstone bridge circuit, but for bonding wires (not shown) and leads (not shown) used for impressing a reference potential to the Wheatstone bridge circuit, the first protective resin portion 6 also serves, of course, to prevent release of air bubbles from interfaces between the leads and the package 1 into the concave portion 1a.

The second protective resin portion 7 covering the first protective resin portion 6 is softer than the first protective resin portion 6, and covers the bonding wires 4, the bonding pads 2a, and the diaphragm 3a. In case where the semiconductor pressure sensor is used for detecting an intake air pressure in a motor vehicle for example, a fluorine-based resin with high chemical resistance such as gasoline, engine oil, etc., is used as the second protective resin portion 7.

In the semiconductor pressure sensor as constructed above, when the pressure of the medium or fluid to be measured is applied from a direction of arrow A to the diaphragm 3a, the diaphragm 3a is caused to strain deformed. As a result, a stress is applied to the strain gauge, and the resistance value of the strain gauge changes in proportion to the magnitude of the stress.

On the other hand, the reference potential is impressed to the strain gauge, which constitutes the Wheatstone bridge circuit, through the leads (not shown) and the bonding wires (not shown), so the output voltage from the Wheatstone bridge circuit changes in accordance with a change in the resistance value of the strain gauge. The amount of change in the output voltage of the Wheatstone bridge is output to the outside through the bonding wires 4 and the leads 2, whereby the pressure of the fluid to be measured is detected.

According to the semiconductor pressure sensor as constructed above, since the interfaces between the leads 2 and the package 1 on the side of the concave portion 1a is covered with the first protective resin portion 6 of electrically insulating property, even if there exist air bubbles in minute gaps on the interfaces between the package 1 and the leads 2, it is possible to prevent the air bubbles from being released into the concave portion 1a, and hence it is also possible to prevent breakage or damage of the bonding wires 4 resulting from the air bubbles.

In addition, the bonding wires 4 are uniformly covered with the second protective resin portion 7 that is softer than the first protective resin portion 6. Accordingly, there will be no damage of the bonding wires 4 due to a difference in the coefficient of linear expansion, the elastic modulus, etc., between different protection resin portions.

Moreover, since each of the leads 2 is provided at its one end with a bonding pad 2a that is formed by being bent in its immediate portion toward the diaphragm 3a in a stepwise fashion, the first protective resin portion 6 is formed without covering the bonding wires 4 at all.

Figure 2:
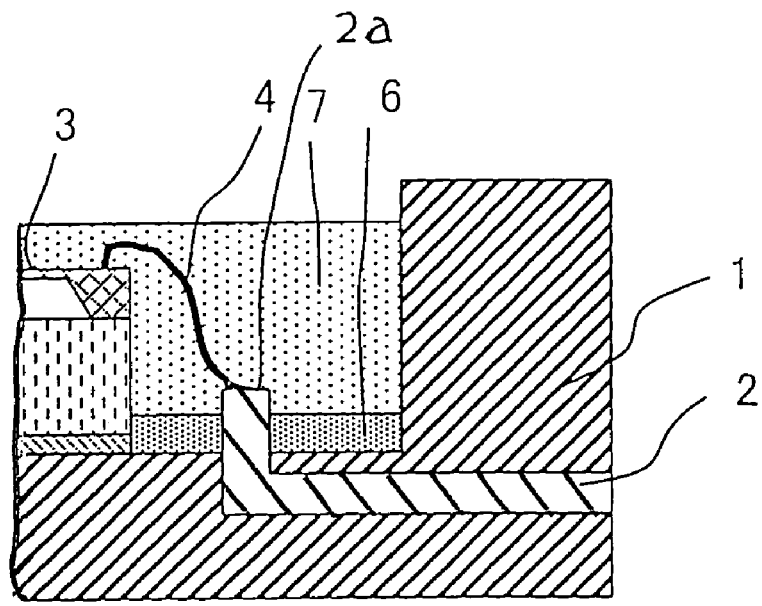
FIG. 2 is a cross sectional view of essential portions of the semiconductor pressure sensor into which leads different from those in FIG. 1 are built.
Figure 3:
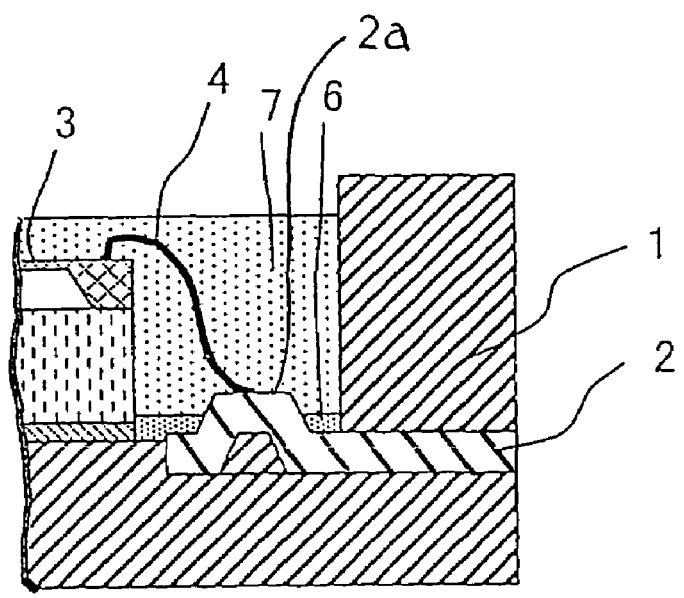
FIG. 3 is a cross sectional view of essential portions of the semiconductor pressure sensor into which leads different from those in FIG. 1 are built.
Figure 4:
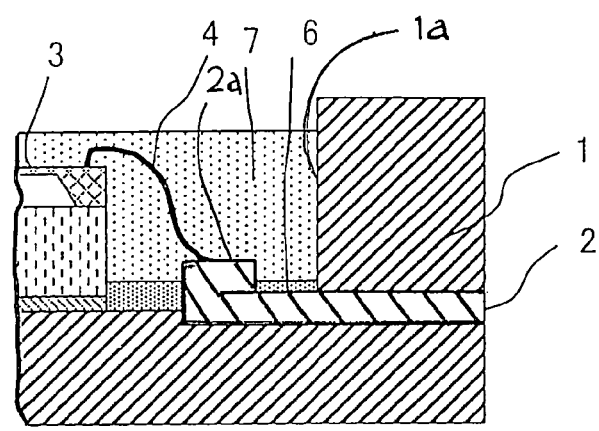
FIG. 4 is a cross sectional view of essential portions of the semiconductor pressure sensor into which leads different from those in FIG. 1 are built.

Here, note that the configuration or shape of the one end of each lead 2 may be as shown in FIG. 2, FIG. 3 or FIG. 4.

In the case of a lead 2 shown in FIG. 2, one end of the lead 2 is bent at an angle of 90 degrees, and a bonding wire 4 is connected at its one end with a tip face or edge of the bent end of the lead 2.

In this case, the lead 2 is bent at an angle of 90 degrees, so the thickness of a first protective resin portion 6 can be set without receiving the influence of the thickness of the lead 2. Also, there is an advantage that a molding die used when the package 1 and the lead 2 are molded by insert molding also need only have a simple construction.

In addition, in the case of a lead 2 shown in FIG. 3, one end of the lead 2 is formed into a trapezoidal shape by press forming, and a bonding wire 4 is connected at its one end with a top side or face of the trapezoidal end of the lead 2.

In this case, too, similar to the one shown in FIG. 2, the thickness of a first protective resin portion 6 can be set without receiving the influence of the thickness of the lead 2.

Further, in the case of a lead 2 shown in FIG. 4, one end of the lead 2 is turned back or bent at an angle of 180 degrees, and a bonding wire 4 is connected at its one end with an upper face of the turned-back end of the lead 2.

In this case, too, similar to the one shown in FIG. 2, the thickness of a first protective resin portion 6 can be set without receiving the influence of the thickness of the lead 2.

Embodiment 2

Figure 5:
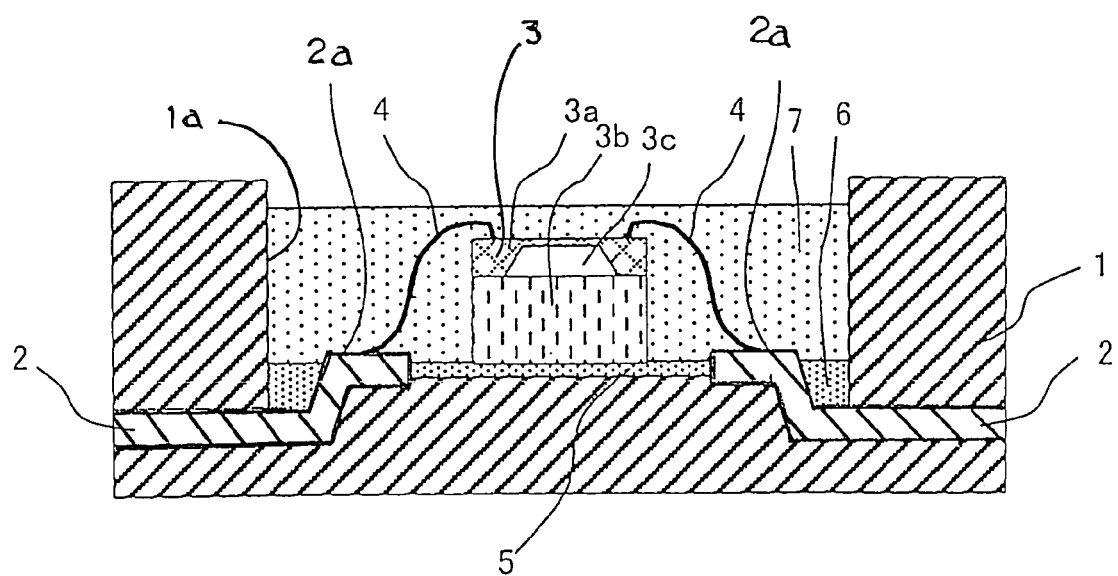
FIG. 5 is a cross sectional view showing a semiconductor pressure sensor according to a second embodiment of the present invention.

FIG. 5 is a cross sectional view that shows a semiconductor pressure sensor according to a second embodiment of the present invention.

In this semiconductor pressure sensor, a sensor chip 3 is bonded to the bottom of a concave portion 1a through a first protective resin portion 6.

The construction of this second embodiment other than the above is similar to that of the first embodiment.

According to the semiconductor pressure sensor of this embodiment, advantageous effects similar to those of the first embodiment can be achieved, and in addition, the first protective resin portion 6 has not only a function to seal interfaces between leads 2 and a package 1 on the side of the concave portion 1a but also a function to bond the sensor chip 3 to the package 1, whereby a step of applying a bonding material to a bonding portion 5 required in the first embodiment becomes unnecessary and hence assembling efficiency is improved.

Embodiment 3

Figure 6:
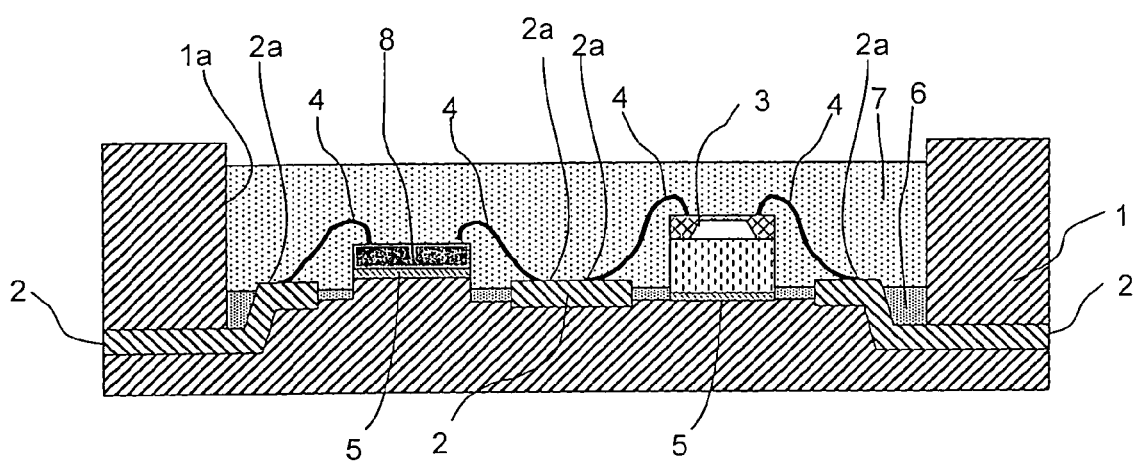
FIG. 6 is a cross sectional view showing a semiconductor pressure sensor according to a third embodiment of the present invention.

FIG. 6 is a cross sectional view that shows a semiconductor pressure sensor according to a third embodiment of the present invention.

In this semiconductor pressure sensor, a processor chip 8, which serves to correct and amplify an electric signal from a sensor chip 3 for detecting pressure, is arranged in a concave portion 1a together with the sensor chip 3.

The processor chip 8 in the form of a semiconductor chip is bonded to a protruded portion of the bottom of the concave portion 1a through a bonding portion 5.

In this processor chip 8, too, similar to the sensor chip 3, a plurality of bonding wires 4 are connected at their opposite ends with bonding pads 2a and edges of the processor chip 8 by means of thermo-compression bonding using ultrasonic waves in combination.

The construction of this third embodiment other than the above is similar to that of the first embodiment, and the same advantageous effects as in the first embodiment can be achieved.

Here, note that in the above-mentioned first through third embodiments, a thermosetting resin is used as the material for the package 1 but a thermoplastic resin may be employed.

In addition, although the sensor chip has been described as the one using a piezoresistive effect, a semiconductor pressure sensor chip of a capacitance type can be used for example.

Moreover, the present invention can also be applied to a semiconductor pressure sensor that is constructed of an IC in which the functions of the sensor chip 3 and the processor chip 8 are formed on one and the same chip.

While the invention has been described in terms of preferred embodiments, those skilled in the art will recognize that the invention can be practiced with modifications within the spirit and scope of the appended claims.

What is claimed is:

1. A semiconductor pressure sensor comprising:
   a package made of a resin and having a concave portion;
   a lead formed integral with said package by insert molding, with its one end exposed into said concave portion and its other end extended from said package to the outside;
   a semiconductor chip arranged in said concave portion; and
   a bonding wire electrically connecting said semiconductor chip and said lead with each other;
   wherein an interface between said lead and said package on the side of said concave portion is covered with a first protective resin portion of electrically insulating property; and
   said bonding wire is covered with a second protective resin portion that is softer than said first protective resin portion, such that said first protective resin does not cover any portion of said bonding wire.

2. The semiconductor pressure sensor as set forth in claim 1, wherein said semiconductor chip is bonded to a bottom of said concave portion through said first protective resin portion.

3. The semiconductor pressure sensor as set forth in claim 1, wherein said lead is provided at its one end with a bonding pad that is formed by being bent in its intermediate portion toward said second protective resin portion in a stepwise fashion.

4. The semiconductor pressure sensor as set forth in claim 1, wherein said semiconductor chip is a sensor chip for detecting pressure.

5. The semiconductor pressure sensor as set forth in claim 1, wherein said semiconductor chip is a processor chip that serves to correct and amplify an electric signal from a sensor chip for detecting pressure.

6. The semiconductor pressure sensor as set forth in claim 5, wherein said sensor chip and said processing chip are arranged in said same concave portion.

\* \* \* \* \*